United States Patent [19]

Cueli

[11] Patent Number: 5,695,808
[45] Date of Patent: Dec. 9, 1997

[54] METHOD FOR MAKING TRANSPARENT REFLECTIVE FILMS

[75] Inventor: Peter Cueli, Belle Mead, N.J.

[73] Assignee: Crown Roll Leaf Inc., Paterson, N.J.

[21] Appl. No.: 642,594

[22] Filed: May 3, 1996

Related U.S. Application Data

[63] Continuation of Ser. No. 310,435, Sep. 22, 1994, abandoned, which is a continuation-in-part of Ser. No. 143,542, Oct. 26, 1993, Pat. No. 5,513,019, which is a continuation-in-part of Ser. No. 48,769, Apr. 16, 1993, Pat. No. 5,351,142.

[51] Int. Cl.⁶ .................. B05D 3/00; B05D 5/06; H05B 6/02; C23C 16/54
[52] U.S. Cl. .................. 427/9; 427/591; 427/248.1; 427/255.5; 427/296
[58] Field of Search .................. 427/9, 10, 591, 427/161, 166, 255.5, 296, 248.1; 73/866

[56] References Cited

U.S. PATENT DOCUMENTS

| | | | |
|---|---|---|---|
| 3,552,853 | 1/1971 | Sanders et al. | 355/133 |
| 3,578,845 | 5/1971 | Brooks | 359/15 |
| 3,580,657 | 5/1971 | Sheridon | 359/3 |
| 3,703,407 | 11/1972 | Hannan | 117/138.8 |
| 3,790,245 | 2/1974 | Hannan et al. | 359/3 |
| 3,858,977 | 1/1975 | Baird et al. | 356/71 |
| 3,869,301 | 3/1975 | Decker et al. | 430/2 |
| 3,887,742 | 6/1975 | Reinnagel | 428/211 |
| 4,014,602 | 3/1977 | Ruell | 359/2 |
| 4,034,211 | 7/1977 | Horst et al. | 235/454 |
| 4,045,125 | 8/1977 | Farges | 350/166 |
| 4,168,346 | 9/1979 | Pezzoli | 428/443 |
| 4,269,473 | 5/1981 | Flothmann et al. | 359/2 |
| 4,330,604 | 5/1982 | Wreede et al. | 430/2 |
| 4,389,472 | 6/1983 | Neuhaus et al. | 430/10 |
| 4,419,436 | 12/1983 | Kranser | 430/260 |
| 4,501,439 | 2/1985 | Antes | 283/91 |
| 4,544,835 | 10/1985 | Drexler | 235/487 |
| 4,563,024 | 1/1986 | Blyth | 283/91 |
| 4,582,431 | 4/1986 | Cole | 356/382 |
| 4,597,814 | 7/1986 | Colgate, Jr. | 156/219 |
| 4,631,222 | 12/1986 | Sander | 428/172 |
| 4,758,296 | 7/1988 | McGrew | 156/231 |
| 4,837,044 | 6/1989 | Murarka et al. | 427/10 |
| 4,839,250 | 6/1989 | Cowan | 430/1 |
| 4,856,857 | 8/1989 | Takeuchi et al. | 359/3 |
| 4,906,315 | 3/1990 | McGrew | 156/231 |
| 4,921,319 | 5/1990 | Mallik | 359/1 |
| 4,933,120 | 6/1990 | D'Amato et al. | 263/1.3 |
| 4,953,497 | 9/1990 | Kessler | 118/718 |
| 4,978,804 | 12/1990 | Woell | 568/489 |
| 5,044,707 | 9/1991 | Mallik | 359/2 |
| 5,083,850 | 1/1992 | Mallik et al. | 359/1 |
| 5,093,538 | 3/1992 | Woell | 568/491 |

(List continued on next page.)

FOREIGN PATENT DOCUMENTS

| | | |
|---|---|---|
| 3422908 | 1/1986 | Germany . |
| 631920 | 9/1982 | Switzerland . |
| 2181993 | 5/1987 | United Kingdom . |

OTHER PUBLICATIONS

The Condensed Chemical Dictionary, Third Edition, 1981, p. 1112.

Kinney Engineering Bulletin, #4100.8, Feb. 15, 1960, by David H. Baun, pp. 1–8.

*Primary Examiner*—Shrive Beck
*Assistant Examiner*—Fred J. Parker
*Attorney, Agent, or Firm*—Woodcock Washburn Kurtz Mackiewicz & Norris,LLP

[57] ABSTRACT

A method for making transparent, reflective films includes coating a polymer film with ZnS by charging a set of carbon crucibles with ZnS cubes or pellets. The crucibles are heated by induction in a vacuum deposition chamber having a supply roll of the polymer film and a take-up roll. The ZnS cubes sublimate at a rate matched to web advance to insure a coating thickness for colorless films of at least 1,000 angstroms. The thickness of the ZnS layer on the film is monitored by visual observation of color by a source of visible white light and the rate of transfer of the film is adjusted to control the thickness of the ZnS layer.

17 Claims, 1 Drawing Shee

U.S. PATENT DOCUMENTS

| | | | |
|---|---|---|---|
| 5,107,791 | 4/1992 | Hirokawa et al. | 118/719 |
| 5,128,779 | 7/1992 | Mallik | 359/2 |
| 5,131,752 | 7/1992 | Yu et al. | 356/369 |
| 5,145,212 | 9/1992 | Mallik | 283/86 |
| 5,184,848 | 2/1993 | Itoh et al. | 283/2 |
| 5,351,142 | 9/1994 | Cueli | 359/2 t |

5,695,808

METHOD FOR MAKING TRANSPARENT REFLECTIVE FILMS

CROSS REFERENCE TO RELATED APPLICATION

This is a continuation of application Ser. No. 08/310,435, filed Sep. 22, 1994, abandoned, which is a continuation-in-part of application Ser. No. 08/143,542, filed Oct. 26, 1993, now U.S. Pat. No. 5,515,019 which is a continuation-in-part of application Ser. No. 08/048,769, filed Apr. 16, 1993 now U.S. Pat. No. 5,351,142.

FIELD OF THE INVENTION

The present invention relates to a method for making transparent effective films and products incorporating them, such as, diffraction gratings, and, more particularly, to a method for applying a transparent, colorless, reflective layer to a polymer film.

BACKGROUND OF THE INVENTION

Various applications exist for transparent or semi-transparent films that are reflective when viewed at selected orientations. It should be noted at the outset that even very clear glass or plastic attenuates light to some degree and, in this respect, is not completely transparent. Similarly, a transparent, reflective film which appears transparent at some viewing angles and reflective at others is not completely transparent, but rather, semi-transparent. In the following description, "transparent" is intended to describe a condition that is perceived by the human eye, viz., the appearance of transparency and includes semi-transparency and transparency at selected viewing angles. Transparent, reflective films can be employed as a decorative wrapping paper or as product packaging, as well as for forming diffraction gratings and holograms. Holograms have recently come into wide usage as decorative indicia due to the hologram's unique capacity to reconstruct three-dimensional images from a seemingly two-dimensional surface. Holograms are thus readily identifiable as such, even upon casual inspection, since non-holographic indicia do not create a three-dimensional virtual image. Diffraction gratings have also become popular given their capacity to embody bright, colorful, light-reflective patterns, some of which have an apparent kinetic effect. Diffraction grating patterns also have attributes that render them more suitable than holograms for decorative purposes, i.e., they can be seen from more perspectives and are generally brighter and less sensitive to orientation. Diffraction grating patterns are also suitable for viewing in diffuse lighting conditions, as opposed to illumination by a point source. These qualities have given rise to use of diffraction grating patterns on decorative sheet material, such as, gift wrapping and on other decorated products like greeting cards. It is, on the whole, less demanding to produce an acceptable diffraction grating patterned material than to produce acceptable holograms. This is due to the narrow optimum viewing parameters of holograms and to the graphic content of a hologram, viz., a 3D depiction of a real object or artwork. In contrast, a diffraction grating pattern may be an arbitrary 2D pattern with a very wide range of viewing angles. Because a hologram is visible in its entirety from a particular optimum viewing angle, the integrity (or lack thereof) of the pattern is immediately evident. In contrast, diffraction grating patterns are often partially viewable from many different perspectives. Accordingly, it may be harder to discern defects in diffraction grating patterns than in holograms. The visual effect of holograms and diffraction gratings derive from substantially the same optical principles, however. While the respective methods for origination differ, the mass production of embossed holograms and diffraction gratings is essentially the same. This production method could be briefly described as embossing a microtexture into a suitable substrate followed by application of a reflective layer to the microtexture. Due to these similarities, any references to "holograms" or "diffraction gratings" that follow in this application are intended to refer to both unless specifically indicated otherwise.

Apparatus utilized to fabricate holograms and diffraction gratings are typically complex, expensive and require sophisticated personnel to operate. Accordingly, their production is a specialty which is engaged in by companies which are suitably equipped through substantial capital expenditures. Since holograms and diffraction gratings require sophisticated apparatus to make and have readily identifiable, visually perceptible attributes, they have become commonly employed as a means for verifying or authenticating documents, such as credit cards, driver's licenses and access cards of many types.

In the field of security holograms, it has been recognized that in order to utilize a distributed hologram over the surface of a substrate and, at the same time, avoid obscuring other indicia which appears thereon, the hologram must be at least partially transparent. Mass-produced holograms are typically phase holograms embossed in optically clear thermoplastic film as a microtexture which is overcoated with a reflective layer. To achieve semi-transparency, strategies have been devised relating to the transparency of the reflective layer. For example, U.S. Pat. No. 4,921,319 to Mallik discloses an embossed phase hologram carrying a relief pattern on one surface having no reflective coating thereon. Instead, an air gap is maintained between the hologram and a supporting substrate to cause incident light to be reflected from the surface relief pattern. Since the refractive index of air is significantly different from that of the plastic substrate film in which the holographic pattern is embossed, there is reflection at the interface between the relieved surface and the air gap. The Mallik '319 patent suggests that the combination of the embossed film and the air gap sets up a degree of reflection which is sufficient to read the hologram but is at least partially transparent to permit the reading of indicia that is positioned behind the hologram.

U.S. Pat. No. 5,044,707 to Mallik discloses a phase hologram employing a plurality of discontinuous aluminum dots disposed on the embossed surface as the reflective layer. Because the aluminum dots are discontinuous, a viewer may view through the hologram, i.e., between the dots, to see indicia appearing below the discontinuous holographic pattern.

U.S. Pat. No. 3,578,845 to Brooks suggests that the reflective layers of a hologram may be rendered partially transparent by varying the thickness thereof, namely, from 100 angstroms to 5 microns. Such a thin reflective layer achieves the desired transparency, as well as reflectivity.

U.S. Pat. No. 3,703,407 to Harman et al. describes a video playback tape incorporating a holographic relief pattern embossed thereon with a coating having an index of refraction which is different from that of the tape. Hannan et al. suggests that the coating should be essentially transparent, sets forth a few examples and suggests general methods for applying the coating.

U.S. Pat. No. 4,856,857 to Takeuchi et al. describes a transparent holographic effect enhancing layer laminated to a transparent hologram forming layer. The two layers have differing refractive index. Takeuchi et al. suggests numerous potential materials for the hologram forming layer and for the holographic effect enhancing layer including ZnS and teaches that the effect enhancing layer can be applied by vapor deposition, sputtering, reactive sputtering, ion plating, electroplating and coating methods in general.

The foregoing techniques and products do, however, suffer from certain drawbacks. For instance, the air-gap phase hologram concept requires an air pocket to be maintained in the card and does not provide adequate reflectivity to efficiently reconstruct the hologram. The concept of using spaced aluminum dots to form the reflective layer is disadvantageous because the dots obscure the underlying indicia, thereby rendering the hologram less transparent. In addition, the process for producing the spacing between the dots is inconvenient and expensive. Similarly, the concept of varying the thickness of the reflective layer, while producing a semi-transparent hologram, is likewise difficult to achieve using the traditional techniques for depositing metal coatings upon an embossed polymer substrate; and, like the provision of spaced aluminum dots, it achieves increased reflectivity only at the expense of obscuring the underlying indicia. The teachings of Hannan and Takeuchi, while setting forth plausible compositions and techniques for producing transparent holograms in the laboratory, are inadequate to enable one skilled in the art to practice such theories on a production scale.

Besides the use of holograms for security purposes, the present application envisions the use of transparent/semi-transparent diffraction gratings for decorative and security purposes, e.g., on wrapping paper which permit visualization of an item wrapped therein while still exhibiting the decorative effect of the grating. The present invention also contemplates a method for applying high refractive index coatings to smooth films, primarily for decorative effect. In each of these applications, product must be produced on a large scale at low cost and to a high degree of precision. To applicant's knowledge, the prior art does not disclose a commercially viable method for producing these products economically, on a large scale and with the requisite precision.

SUMMARY OF THE INVENTION

The problems and disadvantages associated with conventional methods for making transparent, reflective films are overcome by the present inventive method which includes coating a polymer film with ZnS by charging a crucible with ZnS solids; placing the crucible in a vacuum deposition chamber having a supply roll of the polymer film and a take-up roll; and evacuating the deposition chamber. The crucible is then heated by induction to sublimate the ZnS solids into a vapor. After the ZnS vapor is present, the transfer of the film from the supply roll to the take-up roll is initiated with the film passing in proximity to the crucible and the ZnS vapor during the transfer. ZnS vapor is deposited upon the film to form a layer of ZnS. The thickness of the ZnS layer is monitored and the rate of transfer of the film is adjusted to control the thickness of the ZnS layer.

BRIEF DESCRIPTION OF THE FIGURES

For a better understanding of the present invention, reference is made to the following detailed description of an exemplary embodiment considered in conjunction with the accompanying drawings, in which.

DETAILED DESCRIPTION OF THE EXEMPLARY EMBODIMENT

Figure 1:
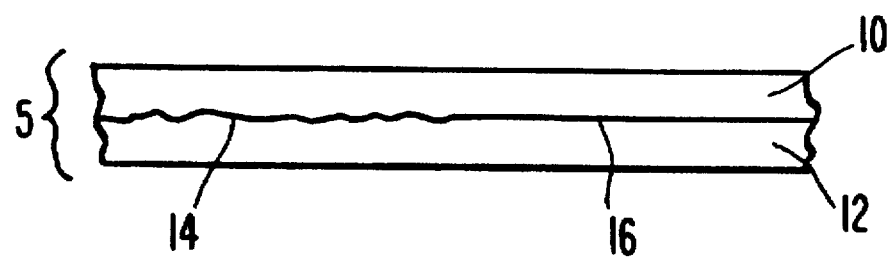
FIG. 1 is an enlarged cross-sectional view of a film coated with a reflective layer and fabricated in accordance with an exemplary embodiment of the present invention.

FIG. 1 shows a laminate 5 formed from a polymer film 10, such as MYLAR brand polyester, and coated with a reflective layer 12. The film 10 is preferably transparent such that light is freely transmitted through the film 10 to be reflected back from the film 10/reflective layer 12 interface to an observer. The reflective layer 12 is a coating, e.g., ZnS, having a refractive index which differs from that of the film 10. The film 10 is embossed along a portion 14 of the surface in contact with layer 12. This embossed portion 14 may represent either a holographic or diffraction grating microtexture. Another portion 16 of the surface of the film 10 in contact with layer 12 is smooth. FIG. 1 thus illustrates that the present inventive method may be used to coat various types of films to yield various products, e.g., smooth films and films embossed with holograms and diffraction gratings. In appearance, the laminate 5 is substantially clear but reflective at selected viewing angles. As a result, the laminate 5 can function as a reflective wrap, diffraction grating or hologram while remaining transparent.

Assuming a commercially feasible method for producing transparent diffraction gratings at modest cost, they can be utilized for material intensive decorative purposes, e.g., in signage, for wrapping paper, or in product packaging, as well as for security purposes. Similarly, transparent, reflective polymer sheeting (webbing) without diffraction grating or holographic microtextures may be employed for wrapping, packaging and decorating.

Having set forth certain of the functional attributes of a coated film in accordance with the present invention, the methods for fabricating it shall now be discussed with reference to FIG. 2.

The present invention employs a reflective layer 12 formed from tin tungsten oxide (SnWO4), zinc sulfide (ZnS), or a mixture of the two. When a mixture of tin tungsten oxide and zinc sulfide is used to form the reflective layer 32, the ratio can be about 80% to about 99% by weight of tin tungsten oxide and about 20% to about 1% by weight of zinc sulfide, it being understood that the percentages of the two components of the resulting mixture should total 100%. Thus, for example, a suitable and preferred ratio is 90% by weight of tin tungsten oxide and 10% by weight of zinc sulfide.

Figure 2:
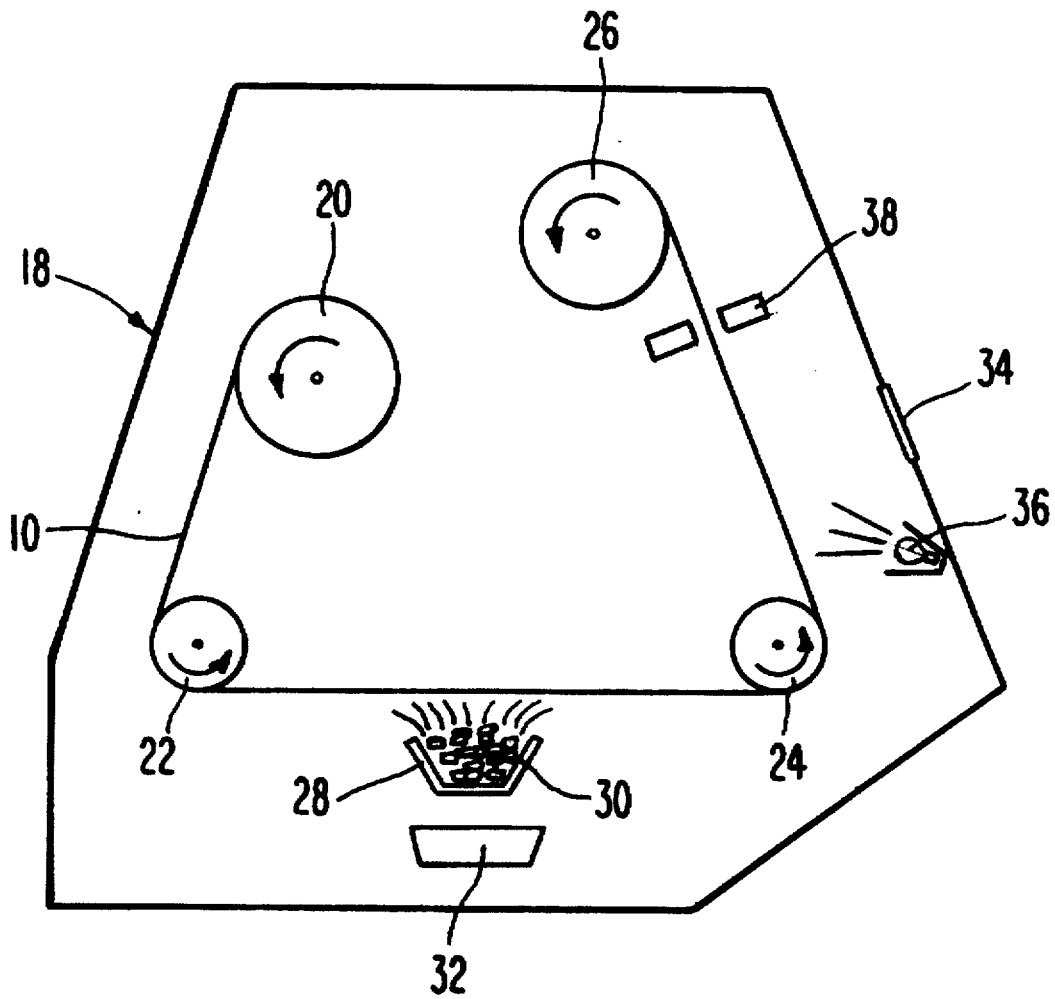
FIG. 2 is a schematic depiction of a vacuum vapor deposition chamber during the coating of a microembossed substrate with a reflective coating.

FIG. 2 shows a vacuum deposition chamber 18 containing a web feed roll 20, a first guide roll 22, a second guide roll 24 and a take-up roll 26. Vacuum deposition chambers of this type are commercially available. In accordance with the present invention, a reflective layer 12 of zinc sulfide may be formed on a web 10 of embossable film, e.g., MYLAR brand polyester, as it is advanced through the vacuum deposition chamber 18 at a vacuum of approximately $10^{-5}$ Torr and at a feed rate in a range of from about 400 feet/minute to about 600 feet/minute. In transferring under tension from the feed roll 20 to the take-up roll 26, the web 10 of polymeric material, which may be smooth or embossed with a holographic or diffraction grating microtexture, passes in close proximity to a carbon crucible 28 containing cubes or pills 30 of ZnS. The crucible 28 and the ZnS cubes 30 are heated to approximate temperatures of 1200 and 1000 degrees C., respectively, by an induction heater 32. An induction heater from Inductotherm of Rancocas, N.J., Model No. 75-96R is appropriate for this purpose. A set of three 5.5" diameter by 3" deep crucibles provide good results for coating a polyester web 10 having dimensions 24" wide by 15,000' long. Crucibles of this type may be obtained from U.S. Graphite, Saginaw, Mich. Coating the web in accordance with the present invention's parameters results in a layer of zinc sulfide having a thickness in a range of from about 1,000 angstroms to about 2,000 angstroms.

The deposition chamber 18 is provided with an observation port 34 through which the coating operation can be visually checked. A light 36 may be included in the chamber 18 to facilitate viewing the web through the port 34. An aspect of the present invention is the recognition that a web with a suitable thickness of ZnS has a different appearance from one which has an inappropriate thickness. More specifically, the thickness of the ZnS coating effects the color of the web due to thin film interference. At thicknesses below 1,000 Angstroms, there is inadequate reflectivity. For thicknesses of 1,000 Angstroms to 2,000 Angstroms, the web appears reflective but almost colorless. Beyond 2,000 Angstroms, the web exhibits the colors of the rainbow with the particular color depending upon the thickness of the ZnS coating. This coloring effect is particularly noticeable when the web being coated, e.g., as shown in FIG. 2, is illuminated by a visible white light source 36 such as a white fluorescent tube. When an operator peers through the viewing port 34, the web, which has been coated with a reflective layer, has a mirrored appearance. Using the mirrored surface of the moving web, the operator can visualize the light 36, preferably a white fluorescent tube having a width approximating or exceeding that of the web, as a reflection in the mirrored web. At coating thicknesses below 2,000 Angstroms, the reflected image of the fluorescent tube appears white. When the coating thickness exceeds 2,000 Angstroms, the bulb appears colored, e.g., yellow or violet. In order to produce an acceptable product in a commercially feasible manner, it is necessary to be able to control the coating thickness and color of the resulting transparent/reflective film. Since a small variation in coating thickness, e.g., 1000 Angstroms, results in unacceptable product, the coating process must be very precise. For example, it is usually preferable for the transparent/reflective layer to be colorless as well as transparent/reflective. The present invention provides a means of achieving a reflective layer that is colorless by monitoring the thickness of the coating.

The present inventive method may be performed by first establishing the proper temperature of the induction crucibles (@1200 degrees Centigrade) that generates a sufficient rate of sublimation of the ZnS cubes 30 and resultant gas density to coat a web passing thereby at a commercially feasible rate of at least 60 ft./min. This temperature is maintained throughout the coating of the web. The thickness of the ZnS coating is determined primarily by controlling the web speed over the sublimating compound. The proper coloration and ZnS thickness for the coated web can therefor be achieved by monitoring the color through the above-described process and then adjusting web speed to give the proper coating thickness. Slower web speed corresponds to greater web thickness. On start up, one can expect to observe colors attributable to greater thicknesses. As the web speed increases, colors corresponding to progressively thinner coatings are observed. When all color disappears but adequate reflectivity is retained, the proper thickness is being applied. Web speed and temperature is then maintained. It should be noted that the web speed is typically adjustable in commercially available vacuum deposition coating machines. Given a sufficient charge of ZnS solids of a suitable dimension, as shall be described below, an entire roll of polymer webbing can be processed in this manner without substantial subsequent adjustments to web speed or temperature.

In addition to visual inspection, a densitometer 38 may be employed to monitor the coating process by electro-optically measuring the optical density or transmissivity of the coated web. Densitometers of this type can be obtained from Custom Fabrication & Services Co., Inc. of Bloomfield, Conn. Increasing the thickness of the ZnS coating decreases transparency and thus the densitometer may be used to measure the thickness of the coating by measuring how much light passes through the web. Any indication of excess thickness of the reflective coating signals that a compensating increase in web speed is required. Conversely, a high transparency indicates that the web speed should be decreased. With respect to ZnS coatings, it has been observed that densitometer instruments of this type are far more sensitive to light absorption in the ultraviolet region, i.e., in a wavelength range of about 300 to 400 nanometers due to the strong absorption of ZnS of light at these wavelengths.

It has been observed that the form of the ZnS, i.e., the size of the particles, the method for heating them, as well as, the temperature and the rate of web advance are all critical to successful commercial production. It should first be understood that in order to be commercially feasible, the costs of production of a product must be controlled. With respect to coating an embossed web with ZnS, the factors having a large impact on cost are throughput, waste and energy expended. In order to be commercially expedient, throughput must be at least 60 ft. per min. Each reduction in throughput results in a corresponding cost increase. Energy input is another large contributor to cost of a product. Given that the sublimation of ZnS requires a lot of "clean" and expensive energy, i.e., electrical power, it is essential that the duration of energy use be minimized. One must also have a rate of sublimation which creates a vapor of sufficient density to coat a web moving at a rate of approximately, e.g., 500 ft./min. to a coating thickness of about 2,000 Angstroms. Further, the sublimation must be relatively even, i.e., if the vapor density fluctuates, the constantly moving web will be coated to varying thicknesses along its length depending upon the varying vapor densities. Thus, one must also obtain a method of heating the ZnS in a manner which provides a constant sublimation at a rate which is matched to the moving web in order to apply a consistent coating. As noted above, the web speed must be adjustable. It has been determined that the best apparatus for sublimating ZnS is by induction with the ZnS contained in carbon crucibles. This is because induction provides a sufficient quantity of heat to generate an adequate gas density to coat a web moving at a commercially feasible rate. Resistance heaters would be far too expensive for this task due to excessively high power requirements and energy consumption. Tantalum boats utilized in resistance heaters are simply not designed to receive a sufficiently large charge of ZnS for operation over an extended period, i.e., a period sufficient for the processing of a roll of plastic film. If a tantalum boat were used, the heat required to sublime the ZnS for an extended period eventually oxidizes and melts the tantalum. Heavier gauge boats are not a solution to this problem. The heavier gauge boats merely increase the amount of current required to create sufficient resistance and heat and thus result in excessive use of electrical power. In addition, the shape of a resistance boat having a receptacle for holding a charge of ZnS would result in a discontinuity in electrical resistance and heat buildup, e.g., in areas of high curvature. On the other hand, carbon crucibles utilized in an induction heating method are quite suitable in that there is no oxidation or melting under the conditions required for sublimation nor any observable reaction between the ZnS and the crucibles.

The form of the ZnS is important to the operation of the method disclosed herein because the degree of comminution effects the surface area sublimating, the rate of sublimation, the weight of the individual particles and their resultant stability when subjected to the expansion of gases resulting from sublimation. If powdered ZnS is used, the rate of sublimation is increased due to the small size of the individual particles and increased overall surface area, however, the small particles tend to pack together closely such that the sublimation occurring at lower levels in a charge generates gases that force the upper layer particles up and out of the crucible in which they are contained. Thus, at the required commercial rates of sublimation, powdered ZnS blows itself out of the crucibles. On the other hand, if a large, singular mass of ZnS is employed, an insufficient rate of sublimation is encountered due to insufficient surface area. Thus, a balance must be struck between sublimation rate and particle stability. It has been determined that ZnS cubes having dimensions in a range of about 1/8" to 3/8" on a side exhibit a workable compromise between surface area and mass, such that a charge of such cubes having a total weight of about 6 kilograms deposited into a set of 3 carbon crucibles having a total volumetric capacity of about 160 square inches and heated to a temperature of about 1200 degrees C. results in a suitable sublimation rate and a resultant gas density in an area above the crucibles for a period of about 30 minutes. This has been found sufficient to coat a web 24"×15,000 feet moving at approximately 500 ft/min. at a proximity of about 12" from the lips of the carbon crucibles with a coating about 2,000 Angstroms thick in about 30 minutes and using approximately 30 kilowatts.

A much larger volume of ZnS must be sublimed as compared to a metal, such as Aluminum, for forming a reflective layer. For example, approximately 6 kilograms of ZnS is required to coat a 24" wide×15,000' roll of substrate web. In contrast, about 22 kilograms of Aluminum is required to coat a similar web with Aluminum metal. It should further be observed that the quality of the reflective layer is far less critical for smooth reflective films and diffraction gratings than for holograms due to the unitary, integrated composition of a hologram as compared to a fragmented diffraction grating pattern or the absence of a pattern. This has an impact on the degree of precision of coating thickness required for the respective products. In general, however, holograms diffraction gratings and unpatterned film are maximized by a ZnS thickness of about 2,000 Angstroms.

An important aspect of the present inventive method is to deposit a coating of optimal thickness. Optimal thickness is that thickness which is minimum while still providing acceptable optical properties. It has been observed that coating thicknesses in excess of 2,000 Angstroms exhibit color rather than being colorless. Thicker layers do have the beneficial effect of increasing the reflectivity of the reflective layer but also cause a corresponding decrease in transparency. For the foregoing reasons, it has been determined that for clear coatings, a thickness between 1,000 and 2,000 angstroms is optimal to provide acceptable reflective effects without a significant loss of transparency. Furthermore, a thickness of about 2,000 angstroms is achievable in accordance with the foregoing technique at a web rate of about 500 ft./min. and an energy input of about 30 kilowatts.

In certain applications, it is desirable to produce a film having a color attributable to the ZnS layer, e.g., red or green. The present invention provides this result if desired. More specifically, if the thinnest layer of ZnS which appears green is desired, one would proceed as before to obtain a clear but reflective surface. The web rate would then be slowly decreased until green is first observed to appear. At that point, web speed would be stabilized. One could obtain green with a thicker layer of ZnS if the web rate were gradually reduced again, whereupon the sequence of rainbow colors would be observed and upon the reperception of green, the change of web speed stopped. Cycling through the rainbow colors with increasing thickness of ZnS (slowing of web) continues until there is a disappearance of color at what is estimated to be about 5,000 to 10,000 Angstroms. This thickness is generally not desirable due to slow web speed, high usage of ZnS and loss of transmissivity.

It should be appreciated that the rate of sublimation of the ZnS and the rate of advancement of the web must be coordinated, not only to assure a proper coating thickness, but to insure that the web will be exhausted before the ZnS cubes. The alternative, namely, to run out of ZnS in the middle of a web results in a great deal of wasted material located interiorly to the roll. This requires the roll to be rerolled with the waste being cut therefrom and the roll spliced. Control of the sublimation rate, initial charge weight and charge particle size all determine whether the aforesaid undesirable occurrences can be avoided.

A reflective layer 12 may be formed in accordance with the above-described process from tin tungsten oxide on a web of embossable film, e.g., MYLAR, by advancing the web through a vacuum deposition chamber held at a vacuum of approximately $10^{-5}$ Torr and at a feed rate in a range of from about 50 feet/minute to about 250 feet/minute. The tin tungsten oxide is evaporated onto the MYLAR film at a temperature of approximately 1000 degrees C.

A reflective layer 12 may be formed in accordance with the above described process from a mixture of tin tungsten oxide and zinc sulfide, on a web of embossable film, e.g., MYLAR, by advancing it through a vacuum deposition chamber at a vacuum of approximately $10^{-5}$ Torr and at a feed rate in a range of from about 400 feet/minute to about 600 feet/minute. The zinc sulfide/tin tungsten oxide mix is evaporated onto the mylar film at a temperature of approximately 1000 degrees C.

Tin tungsten oxide, zinc sulfide, and mixtures thereof are non-toxic substances which are readily available and relatively inexpensive if used prudently. For this reason, diffraction gratings, transparent reflective film and phase holograms fabricated in accordance with the present invention may be mass produced rapidly and without extensive processing, environmental and/or health and safety concerns.

The present invention provides a method for producing transparent reflective films, holograms and diffraction grating materials on a commercially feasible basis, as can be appreciated from the following example.

EXAMPLE A

A roll of polyester material having dimensions 24 inches by 15,000 ft. was loaded onto the feed roll of a induction vapor deposition chamber containing a set of 3 carbon crucibles having the dimensions 5.5" in diameter by 3" deep disposed along the width of the web. A charge of 6 kilograms of ZnS cubes having dimensions 1/2 inch on a side was placed in the crucibles. The chamber was evacuated to a pressure of about $10^{-5}$ Torr. A Varian induction heater control was set at 30 kilowatts for 15 minutes whereupon the take-up roll was activated and the protective shutters opened. The web was observed through a port window for color. Web speed was gradually increased to about 500 feet per minute whereupon a loss of web color was observed. The web remained reflective. The web was fed past the crucibles at a height thereabove of approximately 12". These conditions were continued for about 30 minutes. Approximately ¼ pound of ZnS solids remained in the crucibles after the 15,000 foot run.

After the foregoing process was completed, the resulting roll of material was unwound and tested along its length and width for coating thickness and optical properties. The following results were found to obtain: a clear colorless film of ZnS of approximately 1,000 to 2,000 Angstroms had been deposited on the web. Thin section transmission electron microscopy was used to ascertain the thickness of the ZnS layer.

It should be appreciated by those skilled in the art that the present invention can be practiced with certain variations and that the detailed description of the preferred embodiments is presented for purposes of clarity without an intent to imply limitations to the scope of the invention. All functional equivalents to the above described invention which are within the realm of the normally skilled artisan are considered to be encompassed by the claims herein.

I claim:

1. A method for coating polymer film with zinc sulfide, comprising the steps of:
    (a) placing a crucible containing zinc sulfide solids in a vacuum deposition chamber having a supply roll of the polymer film and a take-up roll for the polymer film;
    (b) evacuating the vacuum deposition chamber;
    (c) heating the crucible containing said zinc sulfide solids by induction to sublimate the zinc sulfide into a zinc sulfide vapor;
    (d) transferring the polymer film from the supply roll to the take-up roll at a rate of at least 60 ft./min. and passing the polymer film in proximity to the crucible, and depositing the zinc sulfide vapor onto the polymer film to form a layer of zinc sulfide on the polymer film, wherein the thickness of the layer of zinc sulfide formed is at least 1000 Angstroms;
    (e) passing the polymer film containing the zinc sulfide layer past a source of visible white light at a location between the location of the crucible containing the zinc sulfide and the take-up roll;
    (f) monitoring the zinc sulfide layer that is deposited on the polymer film by visually observing the presence or absence of color generated from the surface of the zinc sulfide layer as the polymer film passes the source of visible white light; and
    (g) adjusting the rate of transfer of the polymer film from the supply roll to the take-up roll in response to said monitoring step to thereby control the thickness of the zinc sulfide layer on the polymer film.

2. The method of claim 1, wherein said vacuum deposition chamber is evacuated to a pressure of $10^{-5}$ Torr during said step of evacuating and said crucible is heated to a temperature greater than or equal to 1000 degrees Centigrade.

3. The method of claim 1, wherein the weight of the zinc sulfide solids in the crucible placed into the vacuum deposition chamber is about 6 kilograms and said polymer film has a width of about 24 inches and a length of about 15,000 feet.

4. The method of claim 3, wherein the rate of transfer of said polymer film is greater than or equal to 500 ft./minute.

5. The method of claim 4, wherein said roll of polymer film is substantially entirely coated on one side with zinc sulfide using about 30 kilowatts of electrical power.

6. The method of claim 1, wherein said polymer film has a diffraction grating microtexture on at least one surface thereof.

7. The method of claim 1, wherein said polymer film has a hologram microtexture on at least one surface thereof.

8. The method of claim 2, wherein said polymer film passes to within about 12 inches of said crucible during said step of transfer.

9. The method of claim 1, wherein said step of adjusting includes increasing the rate of transfer of said film to decrease the thickness of said zinc sulfide layer.

10. The method of claim 1 wherein the thickness of the zinc sulfide layer is between 1000 and 2000 Angstroms.

11. The method of claim 1 wherein the step of adjusting is performed to regulate the rate of transfer of the film such that the observed zinc sulfide layer is substantially colorless.

12. The method of claim 1 wherein the step of adjusting is performed to regulate the rate of transfer of the film such that the observed zinc sulfide layer is green.

13. The method of claim 1 wherein the thickness of the zinc sulfide layer is in excess of 2000 Angstroms and exhibits color.

14. The method of claim 1 wherein the source of visible white light is a white fluorescent tube.

15. The method of claim 1 wherein the zinc sulfide solids are cube-shaped and have dimensions in the range of about ⅛ to ⅜ inches on a side.

16. The method of claim 1 wherein the transfer rate of the polymer film is from about 400 ft./min. to about 600 ft./min.

17. The method of claim 12 wherein the transfer rate of the polymer film is from about 400 ft./min. to about 600 ft./min.

* * * * *

UNITED STATES PATENT AND TRADEMARK OFFICE
CERTIFICATE OF CORRECTION

PATENT NO. : 5,695,808
DATED : December 9, 1997
INVENTOR(S) : Cueli

It is certified that error appears in the above-identified patent and that said Letters Patent is hereby corrected as shown below:

Column 2, line 59, please delete "Harman" and insert therefor --Hannan--;

Signed and Sealed this

Eighteenth Day of August, 1998

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,695,808
DATED : December 9, 1997
INVENTOR(S) : Peter Cueli

It is certified that error appears in the above-indentified patent and that said Letters Patent is hereby corrected as shown below:

On the title page, the Abstract should read as follows:

A method for making transparent, reflective films includes coating a polymer film with ZnS by charging a set of carbon crucibles with ZnS cubes or pellets. The crucibles are heated by induction in a vacuum deposition chamber having a supply roll of the polymer film and a take-up roll. The ZnS cubes sublimate at a rate matched to web advance to insure a coating thickness for colorless films in the range of 1,000 to 2,000 angstroms. The thickness of the ZnS layer on the film is monitored by visual observation of color or transmissivity and the rate of transfer of the film is adjusted to control the thickness of the ZnS layer.

Signed and Sealed this

Sixth Day of April, 1999

Attest:

*Attesting Officer*

Q. TODD DICKINSON

*Acting Commissioner of Patents and Trademarks*